(12) United States Patent
Pei et al.

(10) Patent No.: US 10,447,225 B2
(45) Date of Patent: Oct. 15, 2019

(54) FILTER APPARATUS AND POWER SUPPLY SYSTEM

(71) Applicant: Huawei Technologies Co., Ltd., Shenzhen, Guangdong (CN)

(72) Inventors: Changsheng Pei, Shenzhen (CN); Yongbing Gao, Shanghai (CN); Heling Zhang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 103 days.

(21) Appl. No.: 15/794,817

(22) Filed: Oct. 26, 2017

(65) Prior Publication Data
US 2018/0048223 A1 Feb. 15, 2018

Related U.S. Application Data

(63) Continuation of application No. PCT/CN2015/093554, filed on Nov. 2, 2015.

(30) Foreign Application Priority Data

Apr. 27, 2015 (CN) .......................... 2015 1 0204806

(51) Int. Cl.
*H03H 1/00* (2006.01)
*H03H 7/42* (2006.01)
(Continued)

(52) U.S. Cl.
CPC ............. *H03H 1/0007* (2013.01); *H02J 3/01* (2013.01); *H02J 3/1835* (2013.01); *H02J 3/24* (2013.01);
(Continued)

(58) Field of Classification Search
CPC ........ H03H 1/0007; H03H 7/427; H03D 3/08; H02J 3/1835; H02J 3/24; H02J 3/01;
(Continued)

(56) References Cited

U.S. PATENT DOCUMENTS 6,636,107 B2 10/2003 Pelly
6,690,230 B2 2/2004 Pelly
(Continued)

FOREIGN PATENT DOCUMENTS

CN 1650503 A 8/2005
CN 1655681 A 8/2005
(Continued)

OTHER PUBLICATIONS

Heoing, Huang, et al., "Analysis of Insertion Loss for Active EMI Filter Based on Load," Electronic Science and Technology, Jan. 15, 2010, 4 pages with translated Abstract.
(Continued)

*Primary Examiner* — Rakesh B Patel
*Assistant Examiner* — Jorge L Salazar, Jr.
(74) *Attorney, Agent, or Firm* — Huawei Technologies Co., Ltd.

(57) ABSTRACT

A filter apparatus, which includes a feedback active common-mode filter and a feed-forward active common-mode filter, the feedback active common-mode filter includes a common-mode noise detection component and a first filter circuit, and the feed-forward active common-mode filter includes the common-mode noise detection component and a second filter circuit, where the first filter circuit is connected between the common-mode noise detection component and the device, and performs feedback filtering on a first common-mode noise signal, to obtain a second common-mode noise signal; the common-mode noise detection component is connected between the first filter circuit and the second filter circuit, detects the second common-mode noise signal, and provides the second filter circuit with the second common-mode noise signal; and the second filter circuit is connected between an external power source and the common-mode noise detection component, and performs
(Continued)

feed-forward filtering on the second common-mode noise signal.

10 Claims, 8 Drawing Sheets

(51) Int. Cl.
*H02J 3/01* (2006.01)
*H02J 3/24* (2006.01)
*H03D 3/08* (2006.01)
*H02M 1/12* (2006.01)
*H02J 3/18* (2006.01)

(52) U.S. Cl.
CPC ............... *H02M 1/12* (2013.01); *H03D 3/08* (2013.01); *H03H 7/427* (2013.01); *H02M 2001/123* (2013.01); *Y02E 40/30* (2013.01); *Y02E 40/40* (2013.01)

(58) Field of Classification Search
CPC ... H02M 1/12; H02M 2001/123; Y02E 40/40; Y02E 40/30
USPC .......................................... 333/175, 181, 262
See application file for complete search history.

(56) References Cited

U.S. PATENT DOCUMENTS

| | | |
|---|---|---|
| 6,775,157 B2 | 8/2004 | Honda |
| 6,781,444 B2 | 8/2004 | Pelly |
| 6,794,929 B2 | 9/2004 | Pelly |
| 6,819,076 B2 | 11/2004 | Takahashi |
| 6,839,250 B2 | 1/2005 | Takahashi et al. |
| 7,180,950 B2 | 2/2007 | Engel et al. |
| 7,187,229 B2 | 3/2007 | Pelly |
| 7,385,438 B2 | 6/2008 | Pelly |
| 7,583,136 B2 | 9/2009 | Pelly |
| 2002/0171473 A1 | 11/2002 | Pelly |
| 2003/0128558 A1 | 7/2003 | Takahashi et al. |
| 2003/0210563 A1 | 11/2003 | Takahashi et al. |
| 2004/0008527 A1 | 1/2004 | Honda |
| 2004/0141275 A1 | 7/2004 | Athari |
| 2004/0246751 A1 | 12/2004 | Honda |
| 2006/0140260 A1 | 6/2006 | Wasaki et al. |
| 2010/0123351 A1 | 5/2010 | Ger et al. |
| 2010/0164285 A1 | 7/2010 | Kitano |
| 2012/0201928 A1 | 8/2012 | Soee et al. |
| 2013/0147419 A1 | 6/2013 | Sakai et al. |
| 2014/0225440 A1 | 8/2014 | Oswald |
| 2015/0003124 A1 | 1/2015 | Sakai et al. |

FOREIGN PATENT DOCUMENTS

| | | |
|---|---|---|
| CN | 1679222 A | 10/2005 |
| CN | 1757173 A | 4/2006 |
| CN | 1774856 A | 5/2006 |
| CN | 100431247 C | 11/2008 |
| CN | 103155388 A | 6/2013 |
| CN | 104081640 A | 10/2014 |
| CN | 104202013 A | 12/2014 |
| CN | 104868466 A | 8/2015 |
| WO | 0007274 A2 | 2/2000 |
| WO | 2014048471 A1 | 4/2014 |

OTHER PUBLICATIONS

Ye, Tian, "Design of Active EMI Filter for DC Power Supplies," Master Dissertation submitted to Graduate School of National University of Defense Technology, Changsha, Hunan, P.R. China, Nov. 2012, Jan. 31, 2015.

Carrillo et al.; "Feedback vs. feedforward common-mode control: a comparative study"; 1998 IEEE International Conference on Electronics, Circuits and Systems; Lisbon, Portugal; Sep. 7-10, 1998; 4 pages.

Chen et al.; "A Novel Hybrid Common-Mode EMI Filter With Active Impedance Multiplication"; IEEE Transactions on Industrial Electronics; vol. 58, No. 5; May 2011; 9 pages.

FILTER APPARATUS AND POWER SUPPLY SYSTEM

CROSS-REFERENCE TO RELATED APPLICATIONS

This application is a continuation application of international patent application number PCT/CN2015/093554 filed on Nov. 2, 2015, which claims priority to Chinese patent application number 201510204806.7 filed on Apr. 27, 2015. The disclosures of the aforementioned applications are hereby incorporated by reference in their entireties.

TECHNICAL FIELD

Embodiments of the present application relate to the field of circuits, and in particular, to a filter apparatus and a power supply system.

BACKGROUND

With a growing quantity of electronic devices, an electromagnetic interference (EMI) phenomenon is increasingly severe. EMI conducted interference includes common-mode interference. To resolve an EMI common-mode interference problem, a conventional method is to add a passive EMI common-mode filter (including a common-mode inductor and a Y capacitor) to a system to suppress noise. However, the passive common-mode filter has disadvantages such as a large size and high costs. In recent years, some scholars use an active filtering technology to resolve the EMI common-mode interference problem, and a new active common-mode EMI filter emerge. According to an active common-mode EMI filter in the prior art, it is generally difficult to balance a conflict between filtering performance and circuit costs.

SUMMARY

Embodiments of the present disclosure provide a filter apparatus and a power supply system, so that filtering performance for common-mode noise can be effectively improved to some degree.

A first aspect provides a filter apparatus, where the filter apparatus is connected between an external power source and a device, the filter apparatus is configured to perform filtering processing on a noise signal from the device, the filter apparatus includes a feedback active common-mode filter and a feed-forward active common-mode filter, the feedback active common-mode filter includes a common-mode noise detection component and a first filter circuit, and the feed-forward active common-mode filter includes the common-mode noise detection component and a second filter circuit, where the first filter circuit is connected between the common-mode noise detection component and the device, and the first filter circuit is configured to perform feedback filtering processing on a first common-mode noise signal from the device, to obtain a second common-mode noise signal;

the common-mode noise detection component is connected between the first filter circuit and the second filter circuit, and the common-mode noise detection component is configured to detect the second common-mode noise signal, and provide the second filter circuit with the second common-mode noise signal; and the second filter circuit is connected between the external power source and the common-mode noise detection component, and the second filter circuit is configured to perform feed-forward filtering processing on the second common-mode noise signal.

With reference to the first aspect, in a first possible implementation manner of the first aspect, the common-mode noise detection component is further configured to provide the first filter circuit with the second common-mode noise signal; and the first filter circuit is further configured to perform feedback filtering processing on the second common-mode noise signal.

With reference to the first possible implementation manner of the first aspect, in a second possible implementation manner of the first aspect, the common-mode noise detection component includes:

a primary side, configured to detect the second common-mode noise signal; and a first secondary side, where an output end of the first secondary side is connected to an input end of the first filter circuit, and the output end of the first secondary side is further connected to an input end of the second filter circuit, to separately provide the first filter circuit and the second filter circuit with the second common-mode noise signal detected by the primary side.

With reference to the first possible implementation manner of the first aspect, in a third possible implementation manner of the first aspect, the common-mode noise detection component includes:

a primary side, configured to detect the second common-mode noise signal; and a second secondary side, where an output end of the second secondary side is connected to an input end of the first filter circuit, to provide the first filter circuit with the second common-mode noise signal detected by the primary side; and a third secondary side, where an output end of the third secondary side is connected to an input end of the second filter circuit, to provide the second filter circuit with the second common-mode noise signal detected by the primary side.

With reference to the second or the third possible implementation manner of the first aspect, in a fourth possible implementation manner of the first aspect, the external power source is a power grid, the power grid is connected to the device by using a power cable, and the power cable includes a phase wire and a neutral line; and the primary side includes:

a first sub-primary side, connected in series on the phase wire; and a second sub-primary side, connected in series on the neutral line.

With reference to the first aspect or any possible implementation manner of the first to the fourth possible implementation manners of the first aspect, in a fifth possible implementation manner of the first aspect, the first filter circuit includes a loop compensation circuit, a first current injection circuit, and a first external power supply circuit, where an input end of the loop compensation circuit is connected to the common-mode noise detection component, and an output end of the loop compensation circuit is connected to an input end of the first current injection circuit, to provide the first current injection circuit with a current signal;

an output end of the first current injection circuit is connected to protection ground, to inject, into the protection ground, the current signal output by the loop compensation circuit; and the first external power supply circuit is configured to provide the loop compensation circuit with a working voltage.

With reference to the fifth possible implementation manner of the first aspect, in a sixth possible implementation manner of the first aspect, the second filter circuit includes: a voltage/current conversion circuit, a second current injection circuit, and a second external power supply circuit, where an input end of the voltage/current conversion circuit is connected to the common-mode noise detection component, an output end of the voltage/current conversion circuit is connected to an input end of the second current injection circuit, and the voltage/current conversion circuit is configured to provide the second current injection circuit with a current signal;

an output end of the second current injection circuit is connected to the protection ground, to inject, into the protection ground, the current signal output by the voltage/current conversion circuit; and the second external power supply circuit is configured to provide the voltage/current conversion circuit with a working voltage.

With reference to the first aspect or any possible implementation manner of the first to the sixth possible implementation manners of the first aspect, in a seventh possible implementation manner of the first aspect, the filter apparatus further includes a differential-mode filter, where the differential-mode filter is connected between the external power source and the second filter circuit, and the differential-mode filter is configured to perform filtering processing on a differential-mode noise signal from the device.

With reference to the first aspect or any possible implementation manner of the first to the seventh possible implementation manners of the first aspect, in an eighth possible implementation manner of the first aspect, the filter apparatus further includes a high frequency passive common-mode filter, where the high frequency passive common-mode filter is connected between the first filter circuit and the device, and the high frequency passive common-mode filter performs filtering processing on an initial common-mode noise signal from the device, where the first noise signal processed by the first filter circuit is a common-mode noise signal obtained after the initial common-mode noise signal is processed by the high frequency passive common-mode filter.

A second aspect provides a power supply system, including the filter apparatus provided in the first aspect, an external power source, and a device, where the filter apparatus, the external power source, and the device form a loop by using a line, when the device runs, a common-mode noise signal is generated on the line, and the filter apparatus is configured to filter the common-mode noise signal.

Based on the foregoing technical solutions, in the filter apparatus provided in the embodiments of the present disclosure, a feedback active common-mode filter and a feedforward active common-mode filter are sequentially connected in a direction from a device to an external power source, and filtering performance can be effectively improved by means of two stages of filtering. In addition, the two filters share one common-mode noise detection component, which can effectively reduce circuit costs, complying with a high density and miniaturization trend of current power supply products and having a wide application prospect.

BRIEF DESCRIPTION OF DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. Apparently, the described embodiments are some but not all of the embodiments of the present disclosure. All other embodiments obtained by a person of ordinary skill in the art based on the embodiments of the present disclosure without creative efforts shall fall within the protection scope of the present disclosure.

For ease of comprehension of solutions provided in the embodiments of the present disclosure, the following concepts are first described.

(1) Electromagnetic interference refers to an interference phenomenon generated after an electromagnetic wave interferes with an electronic element, and includes conducted interference and radiated interference. The conducted interference refers to that a signal on one electrical network is coupled to (interferes with) another electrical network by using conductive medium.

In terms of categories, propagation manners of electromagnetic noise may be classified into conducted emission (CE) and radiated emission (RE). The conducted emission refers to a process of propagating electromagnetic noise energy by using one or more conductors (for example, a power cable, a signal line, a control line, or another metal body).

The power cable is a major path through which the conducted interference is transmitted into and out of a device. Through the power cable, interference in the power grid may be transmitted to a device, interfering with normal operation of the device. Similarly, interference generated by the device may also be transmitted to the power grid through the power cable, interfering with normal operation of another device.

(2) Common-mode interference refers to a potential difference between a power cable and the earth, or between a neutral line and the earth. For a three-phase circuit, the common-mode interference exists between any phase and the earth. The common-mode interference may also be construed as common signal interference simultaneously loaded at each input signal interface end. The common-mode interference is transmitted between a signal line and the earth, and is asymmetric interference.

(3) Differential-mode interference refers to a potential difference between a power cable and a neutral line. For example, interference between a neutral line and a live line of a power grid is referred to as the differential-mode interference.

Figure 1:
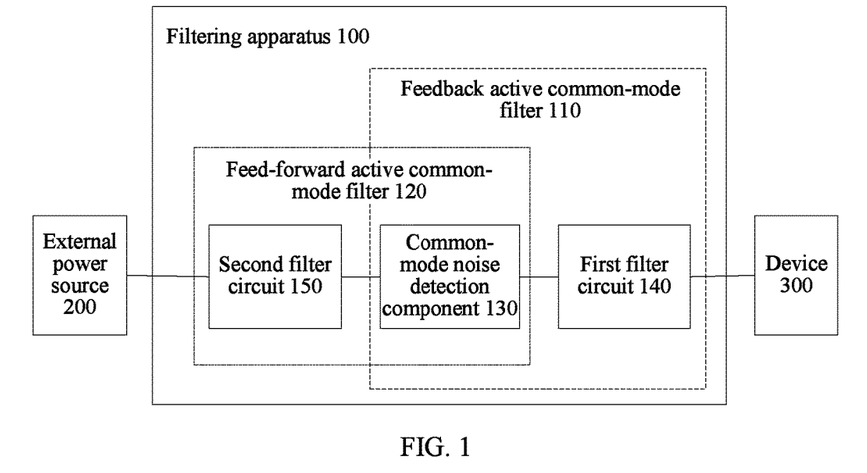
FIG. 1 is a schematic block diagram of a filter apparatus according to an embodiment of the present disclosure.

FIG. 1 is a schematic block diagram of a filter apparatus 100 according to an embodiment of the present disclosure. As shown in FIG. 1, the filter apparatus 100 is connected between an external power source 200 and a device 300, the filter apparatus 100 is configured to perform filtering processing on a noise signal from the device 300, the filter apparatus 100 includes a feedback active common-mode filter 110 and a feed-forward active common-mode filter 120, the feedback active common-mode filter 110 includes a common-mode noise detection component 130 and a first filter circuit 140, and the feed-forward active common-mode filter 120 includes the common-mode noise detection component 130 and a second filter circuit 150, where the first filter circuit 140 is connected between the common-mode noise detection component 130 and the device 300, and the first filter circuit 140 is configured to perform feedback filtering processing on a first common-mode noise signal from the device 300, to obtain a second common-mode noise signal;

the common-mode noise detection component 130 is connected between the first filter circuit 140 and the second filter circuit 150, and the common-mode noise detection component 130 is configured to detect the second common-mode noise signal, and provide the second filter circuit 150 with the second common-mode noise signal; and the second filter circuit 150 is connected between the external power source 200 and the common-mode noise detection component 130, and the second filter circuit 150 is configured to perform feed-forward filtering processing on the second common-mode noise signal.

In this embodiment of the present disclosure, the device 300 may be a load taking power from the external power source 200, or the device 300 may be a device, such as an inverter, that supplies power to the external device 200. The external power source is, for example, a power grid or a battery. It should be understood that, the external power source 200 is connected to the device 300 by using a power cable, and during operation, the device 300 generates a noise signal, such as a common-mode noise signal, on the power cable. In this embodiment of the present disclosure, the feedback active common-mode filter 110 and the feed-forward active common-mode filter 120 sequentially perform filtering processing on the noise signal from the device before the noise signal reaches the external power source 200, which can effectively reduce impact of the noise signal on the external power source, and also indirectly reduces impact of the noise signal on another device connected to the external power source.

In addition, in this embodiment of the present disclosure, in a direction from a noise generator (corresponding to the device 300 in FIG. 1) to the external power source, the feedback active common-mode filter 110 is in front of the feed-forward active common-mode filter 120, and the feedback active common-mode filter 110 and the feed-forward active common-mode filter 120 share one common-mode noise detection component 130, so that the filter 110 and the filter 120 detect a same signal-to-noise ratio of the noise signal, which is equivalent to using a feed-forward active common-mode filter or a feedback active common-mode filter to detect a signal-to-noise ratio of a noise signal in the conventional technology, helping improve a filtering effect. In addition, the feedback active common-mode filter 110 and the feed-forward active common-mode filter 120 share one common-mode noise detection component 130, which significantly reduces circuit costs and complies with a high density and miniaturization trend of current power supply products.

Therefore, in the filter apparatus provided in this embodiment of the present disclosure, a feedback active common-mode filter and a feed-forward active common-mode filter are sequentially connected in a direction from a noise generator (corresponding to the device in FIG. 1) to an external power source, and the two filters share one common-mode noise detection component, which can effectively improve an overall filtering effect of a filter circuit on one hand, and effectively reduce circuit costs on the other hand, complying with a high density and miniaturization trend of current power supply products, and having a wide application prospect.

In this embodiment of the present disclosure, for ease of understanding and description, the device 300 shown in FIG. 1 is also referred to as a noise generator.

Optionally, in this embodiment of the present disclosure, the common-mode noise detection component 130 is further configured to provide the first filter circuit 140 with the second common-mode noise signal.

The first filter circuit 140 is further configured to perform feedback filtering processing on the second common-mode noise signal.

Specifically, the common-mode noise detection component 130 separately provides the first filter circuit 140 and the second filter circuit 150 with the detected second common-mode noise signal. The second filter circuit performs feed-forward filtering processing on the second common-mode noise signal, and the first filter circuit 140 performs feedback filtering processing on the second common-mode noise signal.

It should be understood that, assuming that the first filter circuit 140 performs feedback filtering processing on the second common-mode noise signal and obtains a third common-mode noise signal, the common-mode noise detection component 130 may detect the third common-mode noise signal during next detection, and separately provides the third common-mode noise signal for the first filter circuit 140 and the second filter circuit 150, so that the second filter circuit 150 performs feed-forward filtering processing on the third common-mode noise signal, and the first filter circuit 140 performs feedback filtering processing on the third common-mode noise signal, to obtain a fourth common-mode noise signal. This process is repeated.

It should be understood that, in a working process of a feedback common-mode filter, a noise signal detected by a noise detection component is a noise signal on which filtering processing has been performed by the feedback common-mode filter. In a working process of a feed-forward common-mode filter, a noise detection component first detects a noise signal, and then performs filtering on the noise signal. In this embodiment of the present disclosure, the feedback active common-mode filter 110 and the feed-forward active common-mode filter 120 are sequentially connected in a direction from the device 300 to the external power source 200, and it can be understood that the feedback filtering processing of the feedback active common-mode filter 110 and the feed-forward filtering processing of the feed-forward active common-mode filter 120 are sequentially performed on common-mode noise from the device 300, that is, the common-mode noise signal processed by the feed-forward active common-mode filter 120 is a common-mode noise signal that has been processed by the feedback active common-mode filter 110.

For example, when the device 300 runs, a common-mode noise signal a is generated on a power cable, the feedback filtering processing of the feedback active common-mode filter 110 and the feed-forward filtering processing of the feed-forward active common-mode filter 120 are sequentially performed on the common-mode noise signal when the common-mode noise signal a is transmitted to the external power source 200, and a common-mode noise signal b finally reaching a side of the external power source 200 is a common-mode noise signal after two stages of filtering processing. Compared with the common-mode noise signal a originally generated by the device 300, impact on the external power source 200 is significantly reduced. For example, the common-mode noise signal a originally generated by the device 300 is quantized as 1, and it is assumed that filtering performance of the feedback active common-mode filter 110 and filtering performance of the feed-forward active common-mode filter 120 are both ¹⁄₁₀. In this case, a common-mode noise signal a1 is obtained after the common-mode noise signal a is processed by the feedback active common-mode filter 110, where a quantized value of the common-mode noise signal a1 is ¹⁄₁₀. The common-mode noise signal a1 is further processed by the feed-forward active common-mode filter 120, to obtain a common-mode noise signal b, where a quantized value of the common-mode noise signal b is ¹⁄₁₀₀. It can be known that the common-mode noise signal b (for example, the quantized value is ¹⁄₁₀₀) finally reaching the side of the external power source 200 is a common-mode noise signal after two stages of filtering processing. Compared with the common-mode noise signal a (for example, the quantized value is 1) originally generated by the device 300, the common-mode noise signal b is significantly attenuated, which reduces a degree of interference to the external power source 200, and also indirectly reduces a risk of common-mode interference caused by the external power source 200 to another device (other than the device 300) connected to the external power source 200.

It can be known from above that, in this embodiment of the present disclosure, two stages of filtering are implemented by using a feedback active common-mode filter and a feed-forward active common-mode filter, which can effectively improve filtering performance for a common-mode noise signal from a device.

Figure 2:
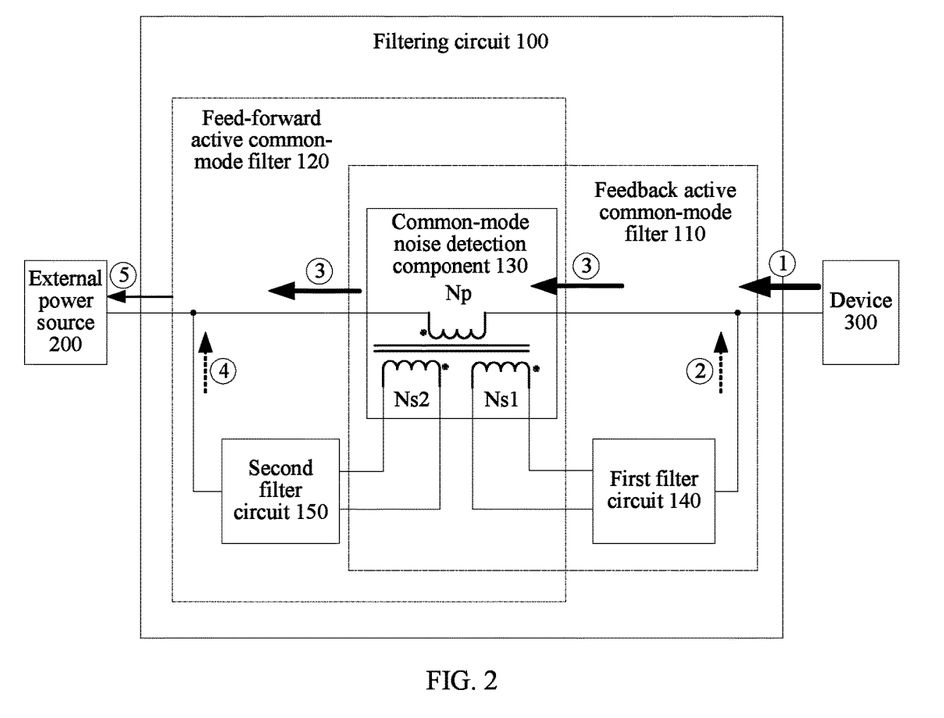
FIG. 2 is another schematic block diagram of a filter apparatus according to an embodiment of the present disclosure.

Optionally, as shown in FIG. 2, in this embodiment of the present disclosure, the common-mode noise detection component 130 includes:

a primary side Np, configured to detect the second common-mode noise signal;

a second secondary side Ns1, where an output end of the second secondary side Ns1 is connected to an input end of the first filter circuit 140, to provide the first filter circuit 140 with the second common-mode noise signal detected by the primary side Np; and a third secondary side Ns2, where an output end of the third secondary side Ns2 is connected to an input end of the second filter circuit 150, to provide the second filter circuit 150 with the second common-mode noise signal detected by the primary side Np.

Specifically, as shown in FIG. 2, the first filter circuit 140 performs feedback filtering processing on a first common-mode noise signal ① from the device 300. Specifically, for example, a reverse cancellation signal ② (which is reverse relative to the first common-mode noise signal ①) is generated to weaken the first common-mode noise signal ①. In this case, the second common-mode noise signal detected by the common-mode noise detection component 130 is a noise signal shown by ③ in FIG. 2. For example, strength of the second common-mode noise signal ③ may be considered as a strength difference between the first common-mode noise signal ① and the cancellation signal ②. The common-mode noise detection component 130 provides the second common-mode noise signal ③ for the second filter circuit 150, and the second filter circuit 150 performs filtering processing on the second common-mode noise signal ③, to generate a cancellation signal ④. In this case, strength of a noise signal ⑤ that has been processed by the second filter circuit 150 and that flows to the side of the external power source 200 may be construed as a strength difference between the second common-mode noise signal ③ and the cancellation signal ④. That is, the noise signal ⑤ shown in FIG. 2 is already weak compared with the first common-mode noise signal ① from the device 300. Therefore, noise interference with an external power source can be significantly reduced.

Therefore, in the filter apparatus provided in this embodiment of the present disclosure, a feedback active common-mode filter and a feed-forward active common-mode filter are sequentially connected in a direction from a noise generator (corresponding to the device in FIG. 1) to an external power source, overall filtering performance of a circuit can be effectively improved by means of two stages of filtering, and two filters share one common-mode noise detection component, which effectively reduces circuit costs.

It should be understood that a specific form of the common-mode noise detection component 130 is provided in FIG. 2 illustratively but not restrictively. In an actual application, another feasible manner may be used, as long as the common-mode noise detection component 130 can detect a common-mode noise signal in a circuit, and can separately provide the first filter circuit 140 and the second filter circuit 150 with the detected common-mode noise signal, which is not limited in this embodiment of the present disclosure.

In this embodiment of the present disclosure, the primary side Np is connected in series on a power cable, and is configured to collect a common-mode noise signal on the power cable. Both secondary sides, that is, the second secondary side Ns1 and the third secondary side Ns2, may obtain, by means of electromagnetic induction, the second common-mode noise signal detected by the primary side. The second secondary side Ns1 is configured to provide the first filter circuit 140 with the second common-mode noise signal, and the third secondary side Ns2 is configured to provide the second filter circuit 150 with the second common-mode noise signal.

Optionally, in this embodiment of the present disclosure, the external power source 200 is a power grid, the power grid is connected to the device 300 by using a power cable, and the power cable includes a phase wire and a neutral line; and the primary side Np includes:

a first sub-primary side Np1, connected in series on the phase wire; and a second sub-primary side Np2, connected in series on the neutral line.

Figure 3:
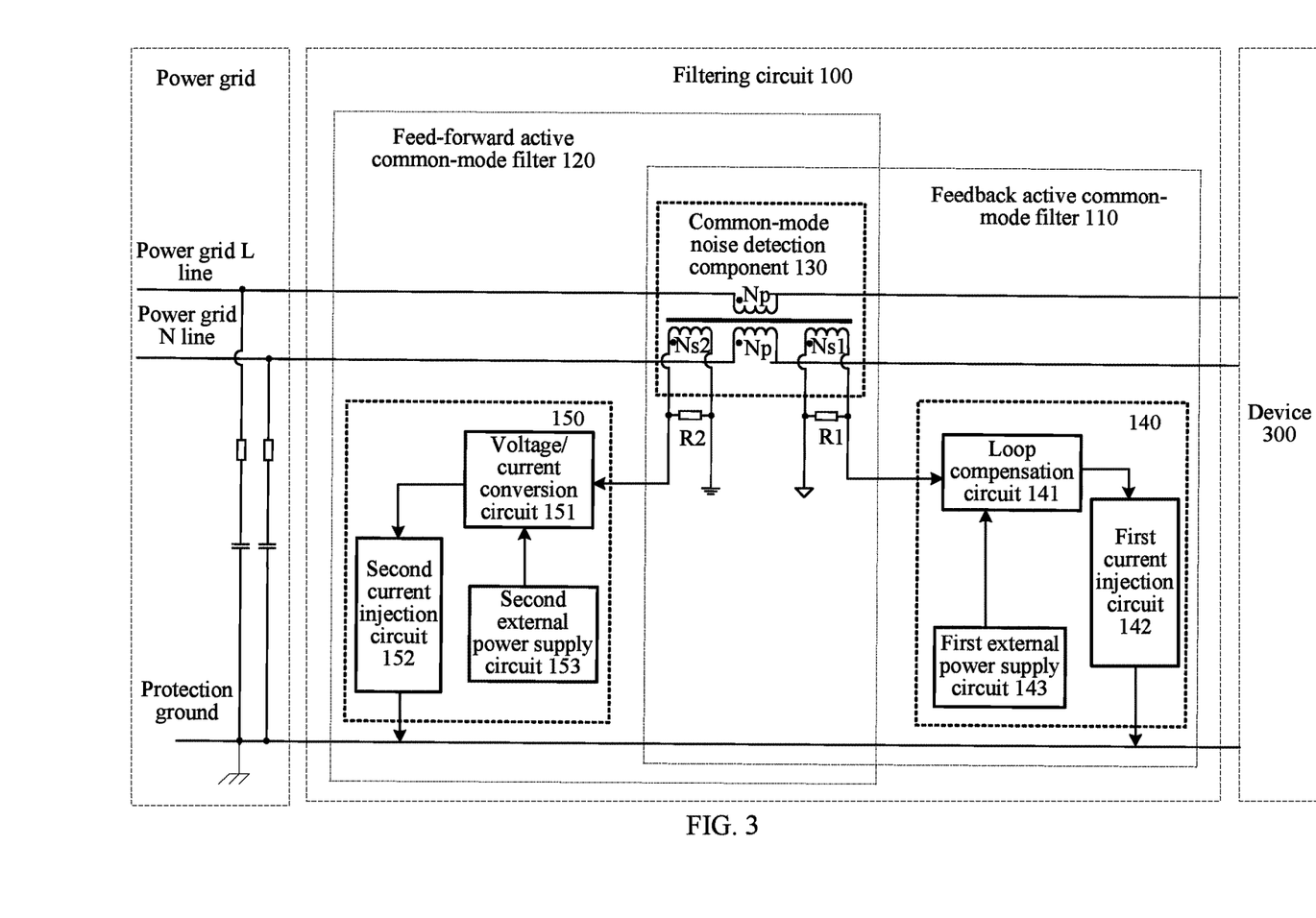
FIG. 3 is still another schematic block diagram of a filter apparatus according to an embodiment of the present disclosure.

Specifically, as shown in FIG. 3, the power cable includes a live line L line and a neutral line N line. Specifically, the common-mode noise detection component 130 includes two primary sides (Np) and two secondary sides (the second secondary side Ns1 and the third secondary side Ns2), where one primary side Np is connected in series on the L line of the power grid, and the other primary side Np is connected in series on the N line of the power grid, to detect a common-mode noise signal on the L line and the N line. Based on an electromagnetic induction principle, the secondary side Ns1 and the secondary side Ns2 separately provide the detected common-mode noise signal to the first filter circuit 140 of the feedback active common-mode filter 110 and the second filter circuit 150 of the feed-forward active common-mode filter 120.

Optionally, as shown in FIG. 3, an output end of the second secondary side is connected in parallel to a resistor R2, an output end of the third secondary side is connected in parallel to a resistor R1, and the two resistors are configured to convert a common-mode noise current signal sampled by the primary side Np into a voltage signal. The resistor R1 may be considered as, for example, an output resistance of a common-mode current transformer, where a resistance value is generally between several ohms and dozens of ohms, or may be considered as an input resistance of the first filter circuit 140, which is not limited in this embodiment of the present disclosure. The resistor R2 generally has a resistance value of thousands of ohms, and may be considered herein as an input resistance of the second filter circuit 150.

Optionally, as shown in FIG. 3, in this embodiment of the present disclosure, the first filter circuit 140 includes: a loop compensation circuit 141, a first current injection circuit 142, and a first external power supply circuit 143, where an input end of the loop compensation circuit 141 is connected to the common-mode noise detection component 130, and an output end of the loop compensation circuit 141 is connected to an input end of the first current injection circuit 142, to provide the first current injection circuit 142 with a current signal;

an output end of the first current injection circuit 142 is connected to protection ground, to inject, into the protection ground, the current signal output by the loop compensation circuit 141; and the first external power supply circuit 143 is configured to provide the loop compensation circuit 141 with a working voltage.

Specifically, the input end of the loop compensation circuit 141 is connected to an output end of the second secondary side Ns1 of the common-mode noise detection component 130.

It should be understood that the current signal output by the loop compensation circuit 141 is a signal used to cancel the first common-mode noise signal. In this case, the first current injection circuit 142 injects, into the protection ground, the current signal output by the loop compensation circuit 141, that is, the current signal is used to cancel the first common-mode noise signal from the device 300. It should be further understood that an event of reducing strength of the first common-mode noise signal ① by the cancellation signal ② shown in FIG. 2 may be construed as an effect generated by injecting, by the first current injection circuit 142 into the protection ground, the current signal output by the loop compensation circuit 141 shown in FIG. 3.

In this embodiment of the present disclosure, specifically, the resistor R1 connected in parallel to the output end of the second secondary side Ns1 may be considered as an input resistance of the loop compensation circuit 141.

Figure 4:
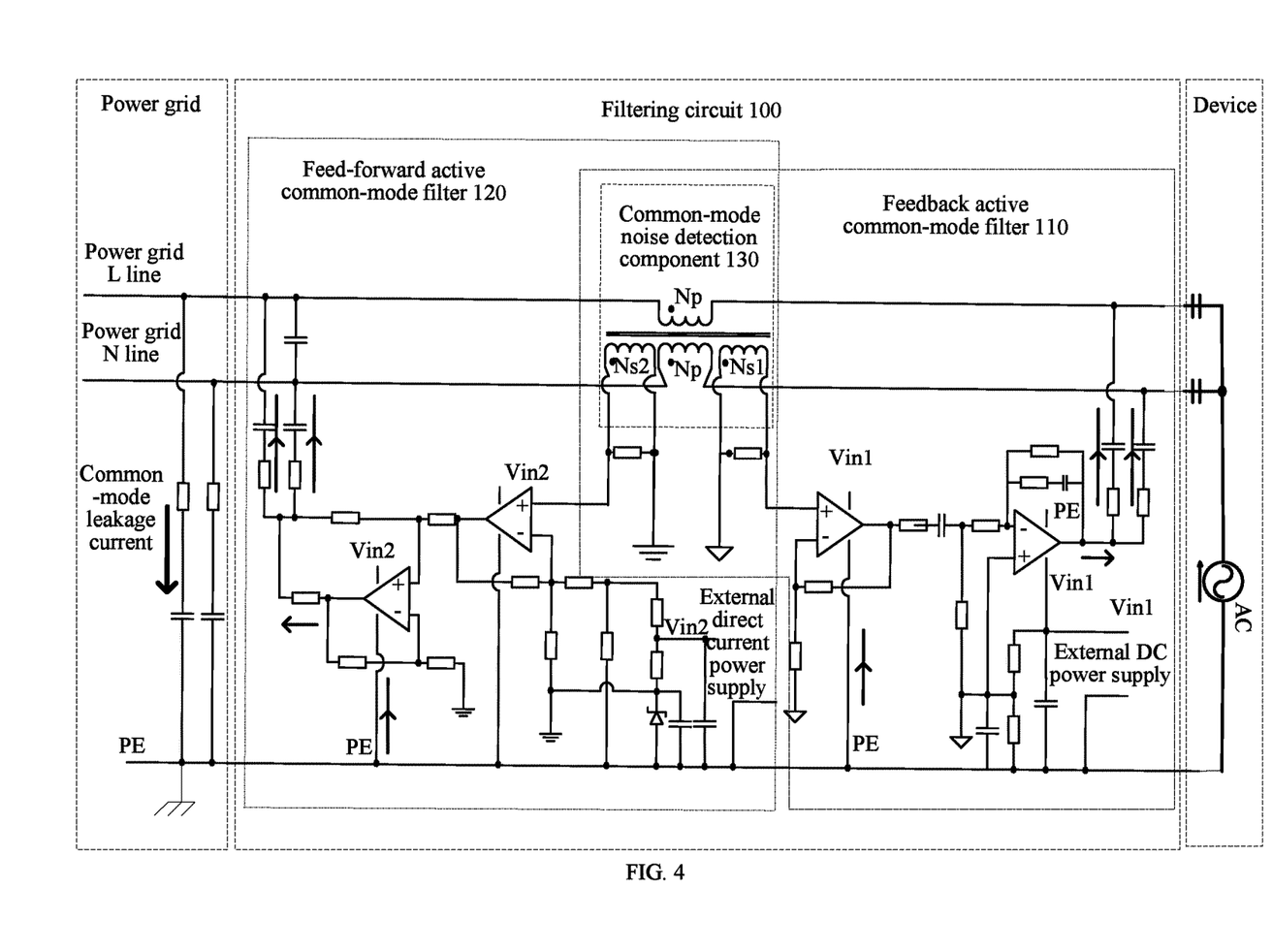
FIG. 4 is still another schematic block diagram of a filter apparatus according to an embodiment of the present disclosure.

Optionally, the loop compensation circuit 141 may be built by an operational amplifier, specifically, as shown in FIG. 4.

It should be understood that the device 300 shown in FIG. 4 is specifically an inverter.

It should be understood that, FIG. 3 and FIG. 4 illustratively but not restrictively provide schematic structural diagrams of the first filter circuit 140 in the feedback active common-mode filter 110. In an actual application, another feasible form in the prior art may also be used for the first filter circuit 140, as long as the first filter circuit 140 can implement feedback filtering in cooperation with the common-mode noise detection component 130, which is not limited in this embodiment of the present disclosure.

Optionally, as shown in FIG. 3, in this embodiment of the present disclosure, the second filter circuit 150 includes: a voltage/current conversion circuit 151, a second current injection circuit 152, and a second external power supply circuit 153, where an input end of the voltage/current conversion circuit 151 is connected to the common-mode noise detection component 130, an output end of the voltage/current conversion circuit 151 is connected to an input end of the second current injection circuit 152, and the voltage/current conversion circuit 151 is configured to provide the second current injection circuit 152 with a current signal;

an output end of the second current injection circuit 152 is connected to the protection ground, to inject, into the protection ground, the current signal output by the voltage/current conversion circuit 151; and the second external power supply circuit 153 is configured to provide the voltage/current conversion circuit 151 with a working voltage.

Specifically, the input end of the voltage/current conversion circuit 151 is connected to an output end of the third secondary side Ns2 of the common-mode noise detection component 130.

It should be understood that the current signal output by the voltage/current conversion circuit 151 is a signal used to cancel the second common-mode noise signal. The second current injection circuit 152 injects, into the protection ground, the current signal output by the voltage/current conversion circuit 151, that is, the current signal is used to cancel the second common-mode noise signal detected by the common-mode noise detection component 130. It should be further understood that an event of reducing strength of the second common-mode noise signal ③ by the cancellation signal ④ shown in FIG. 2 may be construed as an effect generated by injecting, into the protection ground by the second current injection circuit 152, the current signal output by the voltage/current conversion circuit 151 shown in FIG. 3.

In this embodiment of the present disclosure, specifically, the resistor R2 connected in parallel to the output end of the third secondary side Ns2 may be considered as an input resistance of the voltage/current conversion circuit 151.

Optionally, the voltage/current conversion circuit 151 may be built by an operational amplifier, specifically, as shown in FIG. 4.

It should be understood that, FIG. 3 and FIG. 4 illustratively but not restrictively provide schematic structural diagrams of the second filter circuit 150 in the feed-forward active common-mode filter 120. In an actual application, another feasible form in the prior art may also be used for the second filter circuit 150, as long as the second filter circuit 150 can implement feed-forward filtering in cooperation with the common-mode noise detection component 130, which is not limited in this embodiment of the present disclosure.

In the filter apparatus in this embodiment of the present disclosure, mixed use of a feedback active common-mode filter and a feed-forward active common-mode filter combines advantages of feedback filtering, that is, a simple circuit, a variable loop gain, and insensitivity to phase variations, and advantages of feed-forward filtering, that is, strong universality, desirable stability (self-excited oscillation does not occur easily), not oscillating easily, and a high signal-to-noise ratio of a picked up noise signal.

Therefore, in the filter apparatus provided in this embodiment of the present disclosure, a feedback active common-mode filter and a feed-forward active common-mode filter are sequentially connected in series in a direction from a noise generator to an external power source, a detected signal-to-noise ratio of overall noise of a filter circuit may be equivalent to a signal-to-noise ratio detected by a conventional one-stage feedback active common-mode filter, and a relatively strong anti-interference capability and relatively good filtering performance are achieved. Specifically, a relatively high low-frequency insertion loss can be implemented. For example, an insertion loss of a low frequency 150 KHz may be higher than 40 dB. Moreover, filtering performance can be effectively improved by means of two stages of filtering. In addition, the feedback active common-mode filter and the feed-forward active common-mode filter share one common-mode noise detection component, reducing a quantity of noise detection components to be used and reducing circuit costs.

Figure 5:
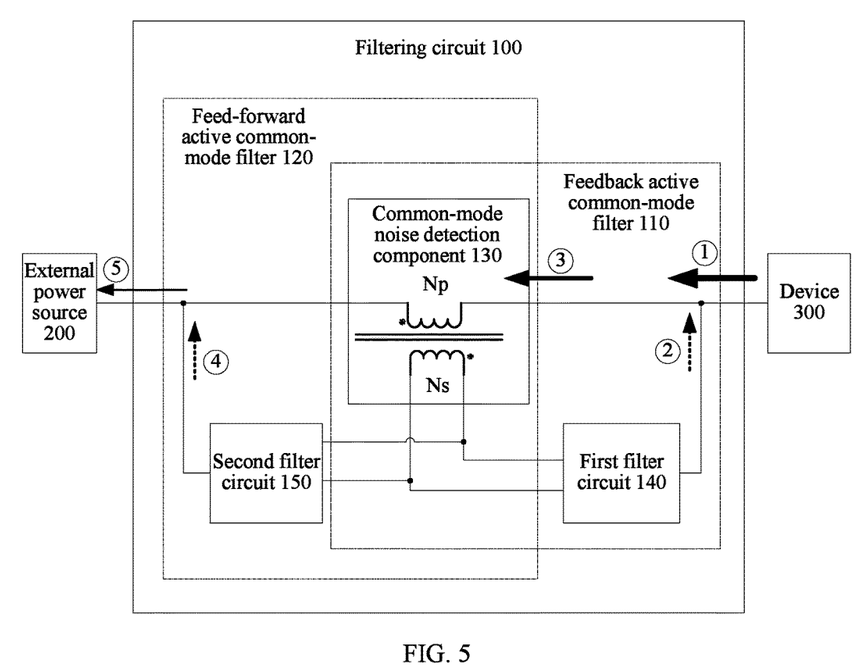
FIG. 5 is still another schematic block diagram of a filter apparatus according to an embodiment of the present disclosure.

Optionally, as shown in FIG. 5, in this embodiment of the present disclosure, the common-mode noise detection component 130 includes:

a primary side Np, configured to detect the second common-mode noise signal; and a first secondary side Ns, where an output end of the first secondary side Ns is connected to an input end of the first filter circuit 140, and the output end of the first secondary side is further connected to an input end of the second filter circuit 150, to separately provide the first filter circuit 140 and the second filter circuit 150 with the second common-mode noise signal detected by the primary side.

Specifically, as shown in FIG. 5, the first filter circuit 140 performs feedback filtering processing on a first common-mode noise signal ① from the device 300. Specifically, for example, a reverse cancellation signal ② (which is reverse relative to the first common-mode noise signal ①) is generated to weaken the first common-mode noise signal ①. In this case, the second common-mode noise signal detected by the common-mode noise detection component 130 is a noise signal shown by ③ in FIG. 2. For example, strength of the second common-mode noise signal ③ may be considered as a strength difference between the first common-mode noise signal ① and the cancellation signal ②. The common-mode noise detection component 130 provides the second common-mode noise signal ③ for the second filter circuit 150, and the second filter circuit 150 performs filtering processing on the second common-mode noise signal ③, to generate a cancellation signal ④. In this case, strength of a noise signal ⑤ that has been processed by the second filter circuit 150 and that flows to the side of the external power source 200 may be construed as a strength difference between the second common-mode noise signal ③ and the cancellation signal ④. That is, the noise signal ⑤ shown in FIG. 2 is already weak compared with the first common-mode noise signal ① from the device 300. Therefore, noise interference with an external power source can be significantly reduced.

In this embodiment of the present disclosure, the second common-mode noise signal detected by the primary side can be provided for the first filter circuit 140 and the second filter circuit 150 by using one secondary side, reducing circuit costs.

Figure 6:
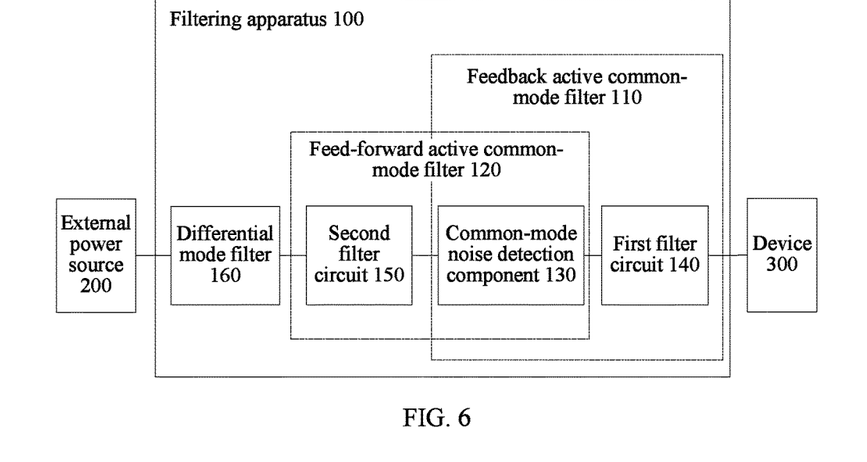
FIG. 6 is still another schematic block diagram of a filter apparatus according to an embodiment of the present disclosure.

Optionally, as shown in FIG. 6, in this embodiment of the present disclosure, the filter apparatus 100 further includes a differential-mode filter 160, where the differential-mode filter 160 is connected between the external power source 200 and the second filter circuit 150, and the differential-mode filter 160 is configured to perform filtering processing on a differential-mode noise signal from the device 300.

Figure 8:
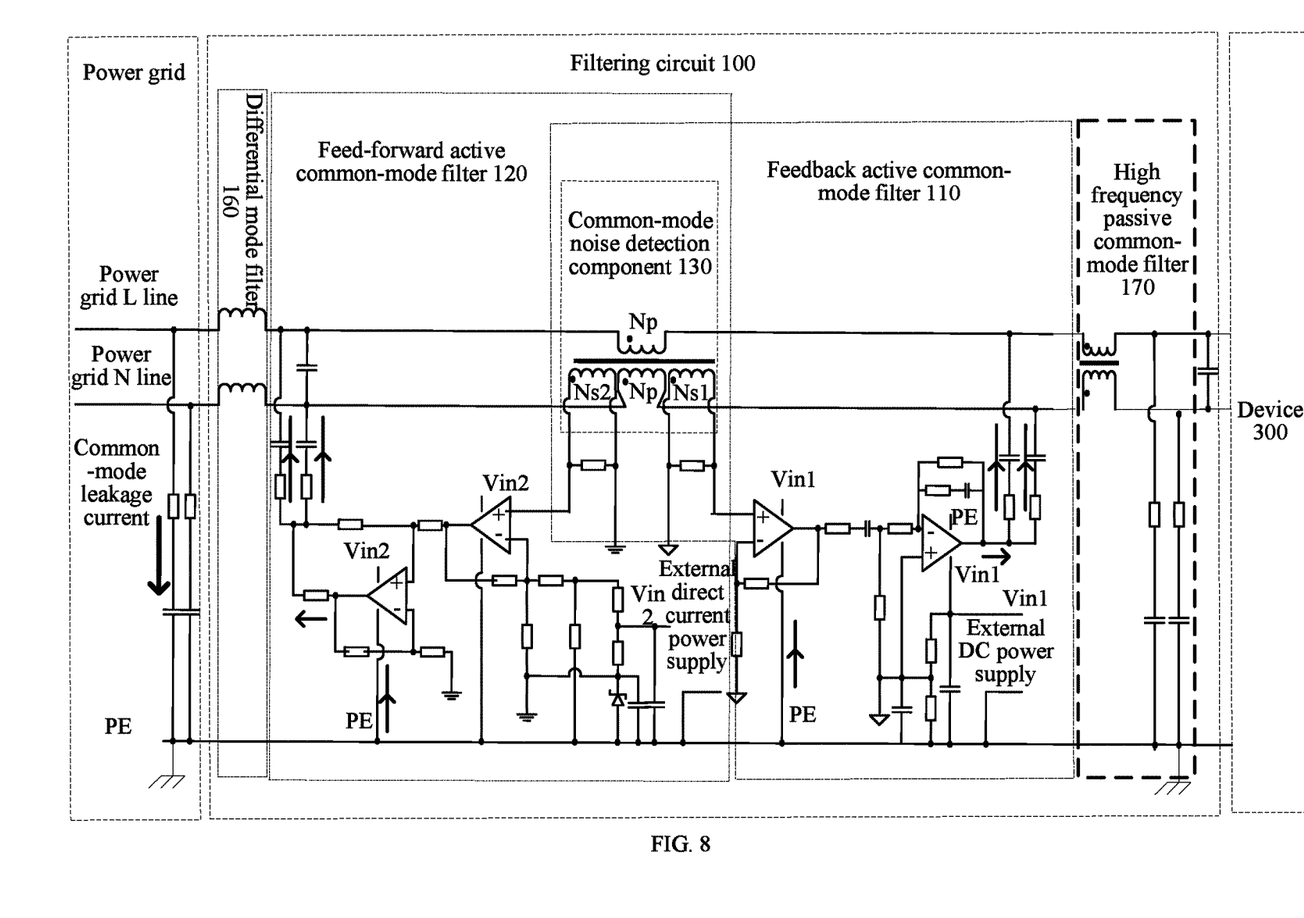
FIG. 8 is still another schematic block diagram of a filter apparatus according to an embodiment of the present disclosure.

Specifically, as shown in FIG. 8, the differential-mode filter 140 may be connected in series on only a live line L line, or the differential-mode filter 140 may be connected in series on only an N line, or the differential-mode filter 140 is connected in series on both the N line and the L line, which is not limited in this embodiment of the present disclosure.

In a direction from a noise generator (corresponding to the device 300 in this embodiment of the present disclosure) to the external power source 200, the differential-mode filter 140 is connected in series behind the feedback active common-mode filter 110 and the feed-forward active common-mode filter 120, the feedback active common-mode filter 110 and the feed-forward active common-mode filter 120 process most common-mode noise signals, and the differential-mode filter 140 is configured to process a differential-mode noise signal in the circuit. It should be understood that, in addition to an original differential-mode noise signal from the device 300, the differential-mode noise signal may further include a differential-mode noise signal generated due to unbalanced common-mode noise signals of the L line and the N line. It should be understood that, when common-mode noise has an imbalance problem on the N line and the L line of the external power source, original common-mode noise may be converted into differential-mode noise. In this embodiment of the present disclosure, the differential-mode filter 140 is connected in series behind the feed-forward active common-mode filter 120 (seen in the direction from the noise generator to the external power source), which can effectively resolve the foregoing problem of conversion from common-mode noise into differential-mode noise. That is, the common-mode noise is first filtered, and then the differential-mode noise is filtered, resolving a problem that it is difficult to filter low frequency noise.

Therefore, in this embodiment of the present disclosure, a feedback active common-mode filter, a feed-forward active common-mode filter, and a differential-mode filter are sequentially connected in series in a direction from a noise generator to an external power source, which can desirably filter low frequency noise (including common-mode noise and differential-mode noise). In addition, the feedback active common-mode filter and the feed-forward active common-mode filter share one common-mode noise detection component, which can effectively reduce circuit costs, complying with a high density and miniaturization trend of power supply products in the prior art and having a wide application prospect.

Preferably, considering that bandwidth of an amplifying circuit is limited, to better process a noise current whose frequency is 1 MHz or higher, one stage of passive common-mode filtering may further be inserted between the noise generator and the feedback active common-mode filter.

Figure 7:
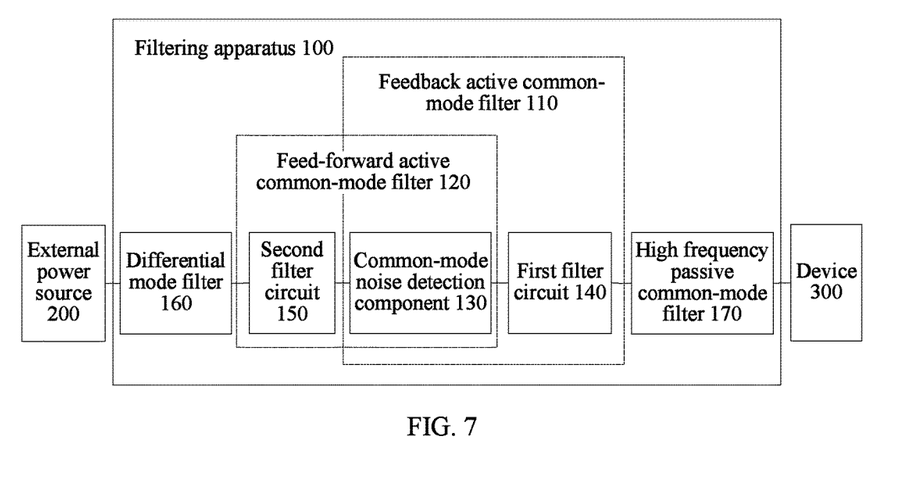
FIG. 7 is still another schematic block diagram of a filter apparatus according to an embodiment of the present disclosure.

Optionally, as shown in FIG. 7, in this embodiment of the present disclosure, the filter apparatus 100 further includes a high frequency passive common-mode filter 170, where the high frequency passive common-mode filter 170 is connected between the first filter circuit 140 and the device 300, and the high frequency passive common-mode filter 170 performs filtering processing on an initial common-mode noise signal from the device 300, where the first noise signal processed by the first filter circuit 140 is a common-mode noise signal obtained after the initial common-mode noise signal is processed by the high frequency passive common-mode filter 170.

Specifically, as shown in FIG. 7, in a direction from a noise generator to an external power source, a first stage is high frequency passive common-mode filtering, a second stage is feedback active common-mode filtering, a third stage is feed-forward active common-mode filtering, and a fourth stage is differential-mode filtering. A connection method of the high frequency passive common-mode filter 170 in a circuit is specifically shown in FIG. 8, which belongs to the prior art, and details are not described herein.

It should be understood that, a filtering effect of a passive filter on a frequency of 1 MHz or higher is obvious. For example, the high frequency passive common-mode filter 150 may be used to process a noise signal whose frequency is 1 MHz or higher.

In this embodiment of the present disclosure, by means of a combination of feed-forward and feedback filtering, it is implemented that two stages of active filters share one common-mode current detection component, reducing a quantity of detection components to be used. In addition, a common-mode filter includes the two stages of active common-mode filters and one stage of high frequency passive filter has an extremely desirable filtering effect over a full band, and a signal-to-noise ratio is the same as that of one-stage feedback active filtering, achieving a relatively strong anti-interference capability. In addition, impact of a sequence of a differential-mode filter and a common-mode filter on overall EMI performance is considered. Common-mode noise has a problem of being unbalanced on the L line and the N line, and the common-mode noise may be converted into differential-mode noise. Therefore, a differential-mode inductor needs to be added to the L line or the N line, to resolve a problem that it is difficult to filter low frequency noise. An optimal structure is that the differential-mode filter is disposed behind an active filter. Common-mode noise is first filtered, and then differential-mode noise is filtered.

Therefore, in the filter apparatus provided in this embodiment of the present disclosure, a first stage is feedback cancellation, and a second stage is feed-forward cancellation, and advantages of a feedback active filter and a feed-forward active filter are combined, which can effectively improve a cancellation effect on a noise signal, that is, a filtering effect is improved. In addition, because a common-mode current detection component detects a common-mode current signal after one stage of feedback active filtering processing, an anti-interference capability of the filter circuit is relatively strong, which is equivalent to improving a filtering effect while keeping a relatively high signal-to-noise ratio. In addition, a feedback active filtering module and a feed-forward active filtering module share one common-mode current detection component, which can significantly reduce circuit costs.

In this embodiment of the present disclosure, the feedback active common-mode filter and the feed-forward active common-mode filter are combined to process a common-mode noise signal in the circuit. It should be understood that performance of an active filter can replace a conventional passive common-mode filter. Active filtering is used in the present disclosure, it is unnecessary to pay special attention to a problem of mismatching between impedance of a noise generator and impedance of a load, and the present disclosure is applicable to common-mode EMI noise filtering of all switch mode power supplies. In addition, in this embodiment of the present disclosure, the high frequency passive common-mode filter 150 needs to only filter high frequency noise, the high frequency passive common-mode filter 150 occupies a small area on a board. In addition, in this embodiment of the present disclosure, in each active common-mode filter, a semiconductor component is used to replace an inductor that has a large volume, which significantly reduces an occupied area on the board. Therefore, the filter apparatus provided in this embodiment of the present disclosure can resolve a problem that a conventional EMI filter occupies a large area on the board. In addition, because a volume of a common-mode inductor is greatly reduced, usage of copper and iron cores is reduced, and a weight reduction purpose is also implemented.

In addition, in this embodiment of the present disclosure, a high frequency passive filter, a feedback active common-mode filter, a feed-forward active common-mode filter, and a differential-mode filter are sequentially connected in series in a direction from a noise generator to an external power source, common-mode noise is first filtered, and then differential-mode noise is filtered, which can prevent a problem that the differential-mode noise, which is converted from the common-mode noise due to unbalanced impedance, flows to the external power source and results in insufficient filtering performance.

Figure 9:
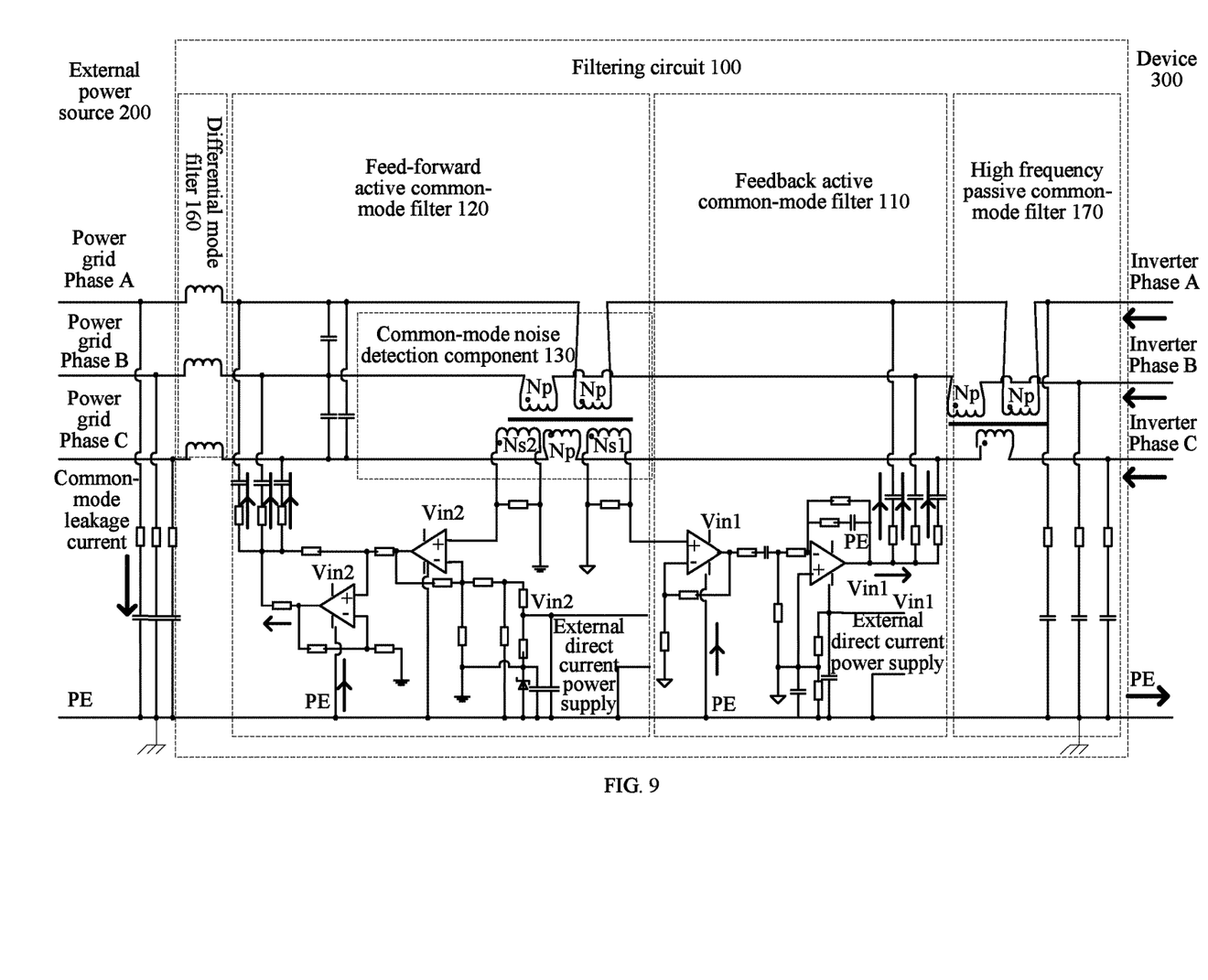
FIG. 9 is still another schematic block diagram of a filter apparatus according to an embodiment of the present disclosure.

The filter apparatus provided in this embodiment of the present disclosure may be applied to all power supply products or power supply systems. For example, the filter apparatus may be connected in series between an external power source and an inverter, or may be connected in series between an external power source and an electric device. For example, the filter apparatus may be applied to a solar grid-tied PV power generating system. Electrical energy may be delivered in a form of a single-phase AC power, which is referred to as single-phase power for short, or may be delivered in a form of three-phase AC power. Specifically, as shown in FIG. 9, the filter apparatus provided in this embodiment of the present disclosure is connected in series in a three-phase AC power scenario.

Therefore, in the filter apparatus provided in this embodiment of the present disclosure, a feedback active common-mode filter and a feed-forward active common-mode filter are sequentially connected in a direction from a noise generator (corresponding to the device in FIG. 1) to an external power source, and the two filters share one common-mode noise detection component, which can effectively improve an overall filtering effect of a filter circuit on one hand, and effectively reduce circuit costs on the other hand, complying with a high density and miniaturization trend of current power supply products, and having a wide application prospect.

Figure 10:
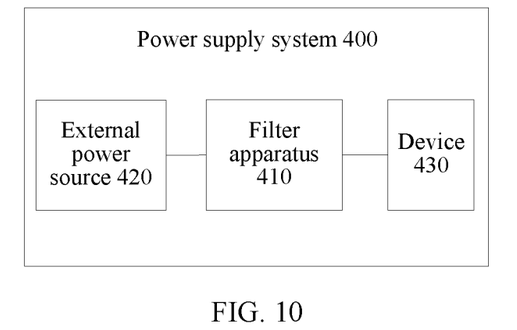
FIG. 10 is a schematic block diagram of a power supply system according to an embodiment of the present disclosure.

FIG. 10 shows a power supply system 400 according to an embodiment of the present disclosure. As shown in FIG. 10, the power supply system includes a filter apparatus 410, an external power source 420, and a device 430, where the filter apparatus 410, the external power source 420, and the device 430 form a loop by using a line, when the device 430 runs, a common-mode noise signal is generated on the line, and the filter apparatus 410 is configured to filter the common-mode noise signal. The filter apparatus 410 may be the filter apparatus 100 provided in the foregoing embodiment.

Therefore, in the power supply system 400 provided in this embodiment of the present disclosure, a feedback active common-mode filter and a feed-forward active common-mode filter are sequentially connected in a direction from a noise generator to an external power source, and the two filters share one common-mode noise detection component, which can effectively improve an overall filtering effect of a filter circuit on one hand, and effectively reduce circuit costs on the other hand, complying with a high density and miniaturization trend of current power supply products, and having a wide application prospect.

It should be understood that sequence numbers of the foregoing processes do not mean execution sequences in various embodiments of the present disclosure. The execution sequences of the processes should be determined according to functions and internal logic of the processes, and should not be construed as any limitation on the implementation processes of the embodiments of the present disclosure.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present disclosure.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present disclosure may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present disclosure essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of the present disclosure. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific implementation manners of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A filter apparatus, wherein the filter apparatus is connected between an external power source and a device, the filter apparatus is configured to perform filtering processing on a noise signal from the device, the filter apparatus comprises a feedback active common-mode filter and a feed-forward active common-mode filter, the feedback active common-mode filter comprises a common-mode noise detection component and a first filter circuit, and the feed-forward active common-mode filter comprises the common-mode noise detection component and a second filter circuit, wherein
the first filter circuit is connected between the common-mode noise detection component and the device, and the first filter circuit is configured to perform feedback filtering processing on a first common-mode noise signal from the device, to obtain a second common-mode noise signal;
the common-mode noise detection component is connected between the first filter circuit and the second filter circuit, and the common-mode noise detection component is configured to detect the second common-mode noise signal, and provide the second filter circuit with the second common-mode noise signal; and the second filter circuit is connected between the external power source and the common-mode noise detection component, and the second filter circuit is configured to perform feed-forward filtering processing on the second common-mode noise signal.

2. The filter apparatus according to claim 1, wherein:
the common-mode noise detection component is further configured to provide the first filter circuit with the second common-mode noise signal; and
the first filter circuit is further configured to perform feedback filtering processing on the second common-mode noise signal.

3. The filter apparatus according to claim 2, wherein the common-mode noise detection component comprises:
a primary side, configured to detect the second common-mode noise signal; and
a first secondary side, wherein an output end of the first secondary side is connected to an input end of the first filter circuit, and the output end of the first secondary side is further connected to an input end of the second filter circuit, to separately provide the first filter circuit and the second filter circuit with the second common-mode noise signal detected by the primary side.

4. The filter apparatus according to claim 2, wherein the common-mode noise detection component comprises:
a primary side, configured to detect the second common-mode noise signal;
a second secondary side, wherein an output end of the second secondary side is connected to an input end of the first filter circuit, to provide the first filter circuit with the second common-mode noise signal detected by the primary side; and
a third secondary side, wherein an output end of the third secondary side is connected to an input end of the second filter circuit, to provide the second filter circuit with the second common-mode noise signal detected by the primary side.

5. The filter apparatus according to claim 3, wherein:
the external power source is a power grid connected to the device by using a power cable comprising a phase wire and a neutral line; and
the primary side comprises:
a first sub-primary side, connected on the phase wire in series, and
a second sub-primary side, connected on the neutral line in series.

6. The filter apparatus according to claim 1, wherein the first filter circuit comprises: a loop compensation circuit, a first current injection circuit, and a first external power supply circuit, wherein
an input end of the loop compensation circuit is connected to the common-mode noise detection component, and an output end of the loop compensation circuit is connected to an input end of the first current injection circuit, to provide the first current injection circuit with a current signal;
an output end of the first current injection circuit is connected to protection ground, to inject, into the protection ground, the current signal output by the loop compensation circuit; and
the first external power supply circuit is configured to provide the loop compensation circuit with a working voltage.

7. The filter apparatus according to claim 6, wherein the second filter circuit comprises: a voltage/current conversion circuit, a second current injection circuit, and a second external power supply circuit, wherein
an input end of the voltage/current conversion circuit is connected to the common-mode noise detection component, an output end of the voltage/current conversion circuit is connected to an input end of the second current injection circuit, and the voltage/current conversion circuit is configured to provide the second current injection circuit with a current signal;
an output end of the second current injection circuit is connected to the protection ground, to inject, into the protection ground, the current signal output by the voltage/current conversion circuit; and
the second external power supply circuit is configured to provide the voltage/current conversion circuit with a working voltage.

8. The filter apparatus according to claim 1, further comprising:
a differential-mode filter connected between the external power source and the second filter circuit and configured to perform filtering processing on a differential-mode noise signal from the device.

9. The filter apparatus according to claim 1, further comprising:
a high frequency passive common-mode filter connected between the first filter circuit and the device and configured to perform filtering processing on an initial common-mode noise signal from the device, and wherein a first noise signal processed by the first filter circuit is a common-mode noise signal obtained after the initial common-mode noise signal is processed by the high frequency passive common-mode filter.

10. A power supply system, comprising:
a filter apparatus, an external power source, and a device, wherein the filter apparatus is connected between the external power source and the device, and the filter apparatus, the external power source, and the device form a loop by using a line, when the device runs, a first common-mode noise signal is generated on the line;
wherein the filter apparatus comprises a feedback active common-mode filter and a feed-forward active common-mode filter, the feedback active common-mode filter comprises a common-mode noise detection component and a first filter circuit, and the feed-forward active common-mode filter comprises the common-mode noise detection component and a second filter circuit, wherein
the first filter circuit is connected between the common-mode noise detection component and the device, and the first filter circuit is configured to perform feedback filtering processing on the first common-mode noise signal from the device, to obtain a second common-mode noise signal;
the common-mode noise detection component is connected between the first filter circuit and the second filter circuit, and the common-mode noise detection component is configured to detect the second common-mode noise signal, and provide the second filter circuit with the second common-mode noise signal; and
the second filter circuit is connected between the external power source and the common-mode noise detection component, and the second filter circuit is configured to perform feed-forward filtering processing on the second common-mode noise signal.

* * * * *